United States Patent [19]

Lee et al.

[11] Patent Number: 4,998,267

[45] Date of Patent: Mar. 5, 1991

[54] X-RAY LITHOGRAPHY CARBON MASK AND METHOD OF MANUFACTURING THE SAME

[75] Inventors: Jaesin Lee; Jinyung Kang, both of Daejeon, Rep. of Korea

[73] Assignee: Korea Electronics & Telecommunications Research Inst., Rep. of Korea

[21] Appl. No.: 370,281

[22] Filed: Jun. 23, 1989

[30] Foreign Application Priority Data

Jul. 28, 1988 [KR] Rep. of Korea .................... 88-9547

[51] Int. Cl.$^5$ .................... G21K 5/00; G03F 9/00; G03C 5/18; G03C 5/00
[52] U.S. Cl. ........................................ 378/35; 430/5; 430/299; 430/297; 378/34
[58] Field of Search .............. 378/34, 35; 430/5, 967, 430/299, 297

[56] References Cited

U.S. PATENT DOCUMENTS 4,604,292 8/1986 Evans et al. .................... 436/967
4,608,526 8/1986 Neukermans et al. ............ 430/5

FOREIGN PATENT DOCUMENTS 0245160 10/1986 Japan ................................ 378/35

*Primary Examiner*—Janice A. Howell
*Assistant Examiner*—Don Wong

*Attorney, Agent, or Firm*—Evenson, Wands, Edwards, Lenahan & McKeown

[57] ABSTRACT

Unwanted distortion of the planar configuration of a carbon-based X-ray lithography mask, that would otherwise occur during selective etching of the (silicon) support substrate, is prevented by incorporating a compensation layer of inorganic material that effectively offsets the internal compressive stress characteristic of the carbon. For this purpose, on a top, planar surface of a silicon substrate, a multiple layer structure containing a first layer of carbon having an internal compressive stress characteristic and a second layer of inorganic material having an internal tensile stress characteristic, is plasma-deposited. The tensile stress characteristic of the inorganic layer compensates for the compressive stress characteristic of the carbon layer and causes the composite structure to retain its substantially planar configuration after the underlying silicon substrate has been etched in the course of obtaining a rim structure on which the X-ray transmissive structure is supported. An X-ray absorption layer is then selectively formed on the composite structure. Preferably, the laminate structure has multiple alternating layers of carbon and inorganic material. The thickness of a carbon layer is on the order of 1000-3000 angstrom, the thickness of a tensile stress layer is on the order of 500-2000 anstroms, and the overall thickness of said laminate structure is on the order of 10000-30000 angstroms.

18 Claims, 3 Drawing Sheets

X-RAY LITHOGRAPHY CARBON MASK AND METHOD OF MANUFACTURING THE SAME

FIELD OF THE INVENTION

The present invention relates in general to semiconductor manufacturing and is particularly directed to an improved carbon X-ray lithography mask formed of a stress-relieving laminate structure.

BACKGROUND OF THE INVENTION

The manufacture of high density, narrow line width integrated circuits requires the use of high resolution lithography equipment. Because of current limitations in the resolution capability of optical lithography equipment, other wafer topography defining processes, such as those employing extremely short wavelengths, pattern forming beams (e.g. X-rays have been developed.

A critical component in the successful utilization of X-ray lithography equipment is the mask through which the X-ray beam defines the topography of the processed wafer. A typical X-ray mask employs an X-ray absorption pattern, usually comprised of a heavy metal, such as gold or tungsten, that is formed on an underlying support membrane. Not only must this membrane be capable of providing a support base for the absorption metal pattern, but it must be highly transparent to the wafer-processing write X-ray beam and to visible light. In this regard, it is normally required that the support membrane have a X-ray transmissivity of at least 50%, that it have a high transmissivity to visible light, particularly laser light, and the physical size of the mask itself must correspond to the size of the underlying (e.g. silicon) substrate to be patterned. Moreover, in terms of its structural parameters the mask, which is planar, must be dimensionally stable and of a uniform thickness with minimal defects.

Materials which have been commonly employed in the construction of X-ray mask for semiconductor lithography processing include carbon and carbide/nitride compounds, such as silicon nitride, boron nitride, silicon carbide, boron carbide, as well as materials such as silundum and silicon, and materials which utilize polymer films. Unfortunately, each material is not without its own problems. For example, silicon nitride, although enjoying thermal and dimensional stability and a high transmissivity to visible light, suffers from low tensile strength. Boron nitride, which is commonly manufactured by chemical deposition, suffers from surface defects. Silicon itself, even though being a material that is directly applicable to the manufacture of semiconductor integrated circuits, has poor transmissivity to visible light.

The choice of organic materials for use as a support membrane has not be actively pursued since such materials typically suffer from thermal and dimensional stability and have a short useful life.

For an illustration of prior art which discloses the use of carbide, nitride and silicon compounds, such as silicon nitride, boron nitride, silicon carbide, etc. attention may be directed to U.S. Pat. Nos. 3,873,824 and 4,608,326, which particularly address the use of silicon carbide as an X-ray mask support material.

Carbon itself, on the other hand, particularly diamond-like carbon, enjoys high transmissivity to both visible rays and X-rays. Moreover, its thermal, mechanical and chemical stability are excellent and a homogeneous film of carbon can be formed by plasma chemical deposition. Consequently, the properties of a membrane formed of high quality carbon make it a particularly attractive material as an X-ray processing mask.

Literature which discloses the use of carbon as the material of the support membrane includes the U.S. Pat. to Brady et al, No. 4,436,797 and published Japanese patent applications Nos. JP 62-174,378 to Morida Chinso, entitled "Manufacturing Method of a Hardened Carbon Film", published July 31, 1987, and JP 61-324,215 by Susuki Kumi, entitled "X-ray Exposure Mask", published by Feb. 15, 1986.

The '797 Brady et al patent discloses the use of hydrogenated amorphous carbon, in which carbon is deposited in the presence of hydrogen at a substrate temperature of less than 375°. The hydrogen concentration in the resulting film is greater than 1% and the optical bandgap of the manufactured film is greater than 1 electron volt, and preferably 2 electron volts.

In the process described in the Chinso publication, a hardened carbon film is formed by reacting an organic monomer in the presence of hydrogen using a plasma CVD process and results in a film having a internal peel stress of $8 \times 10\text{--}9.2 \times 10\text{--}dyne/cm^2$. In the Kumi publication, the X-ray exposure mask produced is formed of a diamond-like carbon film and a built up layer structure containing an organic polymer film.

In conventional processes for depositing carbon films, a simple plasma chemical vapor deposition process is employed. Where a silicon substrate is employed as the support for the carbon film, the substrate is subjected to compressive internal stress, which leads to a warping of a carbon film during subsequent mask processing.

More particularly, with reference to the drawings, FIG. 1(a) shows the formation of a carbon film 102 on an underlying silicon substrate 101. Carbon layer 102 is formed on the silicon substrate 101 by plasma chemical vapor deposition, in which an upper electrode is grounded and the silicon substrate is coupled to a negative potential with a radio frequency voltage of 13.56 MHz established between the electrodes. With the introduction of a reaction gas such as $CH_4$ or $C_2H_6$, and a reactor pressure on the order of 5–100 m Torr, carbon film 102 is deposited upon the silicon substrate 101. The rate of deposition of the carbon depends upon ambient pressure and RF 25 power within the reactor and is typically on the order of 100Å per minute.

A change in the conditions of the deposition process will affect the optical properties of the deposited carbon film 102. In particular, when using methane as a reaction gas, the optical bandgap may be varied between 0.5 eV to 2.5 eV by modifying the ambient conditions within the reactor chamber. The optical bandgap depends significantly upon a self-biased formed on the reactor electrode to which the substrate 101 is coupled. As this self-bias is produced, the optical bandgap increases.

As mentioned previously, one of the factors in the quality of the carbon membrane as an X-ray mask support layer is its internal stress. For an optical bandgap in a carbon film greater than 1.5 eV, the compressive stress within the film is greater than $5 \times 10$ dyne/cm$^2$. As a consequence, when the based silicon substrate 101 upon which the carbon layer is deposited is etched away, so as to provide a silicon support border around the membrane, the internal compressive stress causes the carbon film 102 to warp as shown at (b) of FIG. 1, thus severely altering the planarity of the carbon support membrane and whereby the quality of the X-ray mask.

SUMMARY OF THE INVENTION

In accordance with the present invention, the unwanted warping of a carbon membrane to be used for an X-ray mask, resulting from the inherent internal stress created in the carbon layer, is compensated by forming the carbon film as part of a laminate structure which includes a compressive stress-compensating layer of a material such as silicon carbide, silicon nitride, boron carbide and boron nitride. When deposited on a silicon substrate, a film such as silicon carbide has an inherent internal tensile stress, which falls in a range on the order of $1-10 \times 10$ dyne/cm$^2$, so that it may effectively compensate for the compressive stress of the carbon film which, as pointed out above, may be on the order of $5 \times 10$ dyne/cm$^2$ for an optical bandgap of more than 1.5 eV. The sought after optical/X-ray transmissive properties of the carbon film are retained; yet its tendency to warp because of the inherent internal compressive stress, when formed as is, on a silicon substrate is counter acted by the inherent internal tensile stress of the compensation layers. The optical and X-ray transmissive properties of the compensation layers are sufficiently high to yield a laminate configuration that retains both high optical quality and physical uniformity and stability properties.

BRIEF DESCRIPTION OF THE DRAWINGS

Referring now to FIG. 2, there is shown a layer multi-laminate structure comprised of alternating layers of a carbon film 102 and a compressive stress compensating inorganic film layer 103 formed as a laminate structure atop a silicon substrate 101 in accordance with the X-ray mask structure of the present invention.

As pointed out above, the inherent internal stress created in the alternating inorganic layer 103 is tensile in nature, opposing the compressive stress created in the carbon film 102. One example of the compressive stress compensating film 103 is a silicon carbide film, which may be formed by a mixed gas of SiH, or Si$_2$H$_6$ and CH$_4$ or C$_2$H$_6$, as the reaction gas. A typical thickness of the carbon film 102 in the multi-laminate structure is 1,000-3,000Å, while that of the silicon carbide film 103 is on the order of 500-2,000Å. Advantageously, within the laminate structure, the surface roughness of the film is extremely small, so that there is an overall high quality smoothness to the resulting support membrane structure. The crystal granular size of the laminate film is typically less than 100Å.

Figure 3:
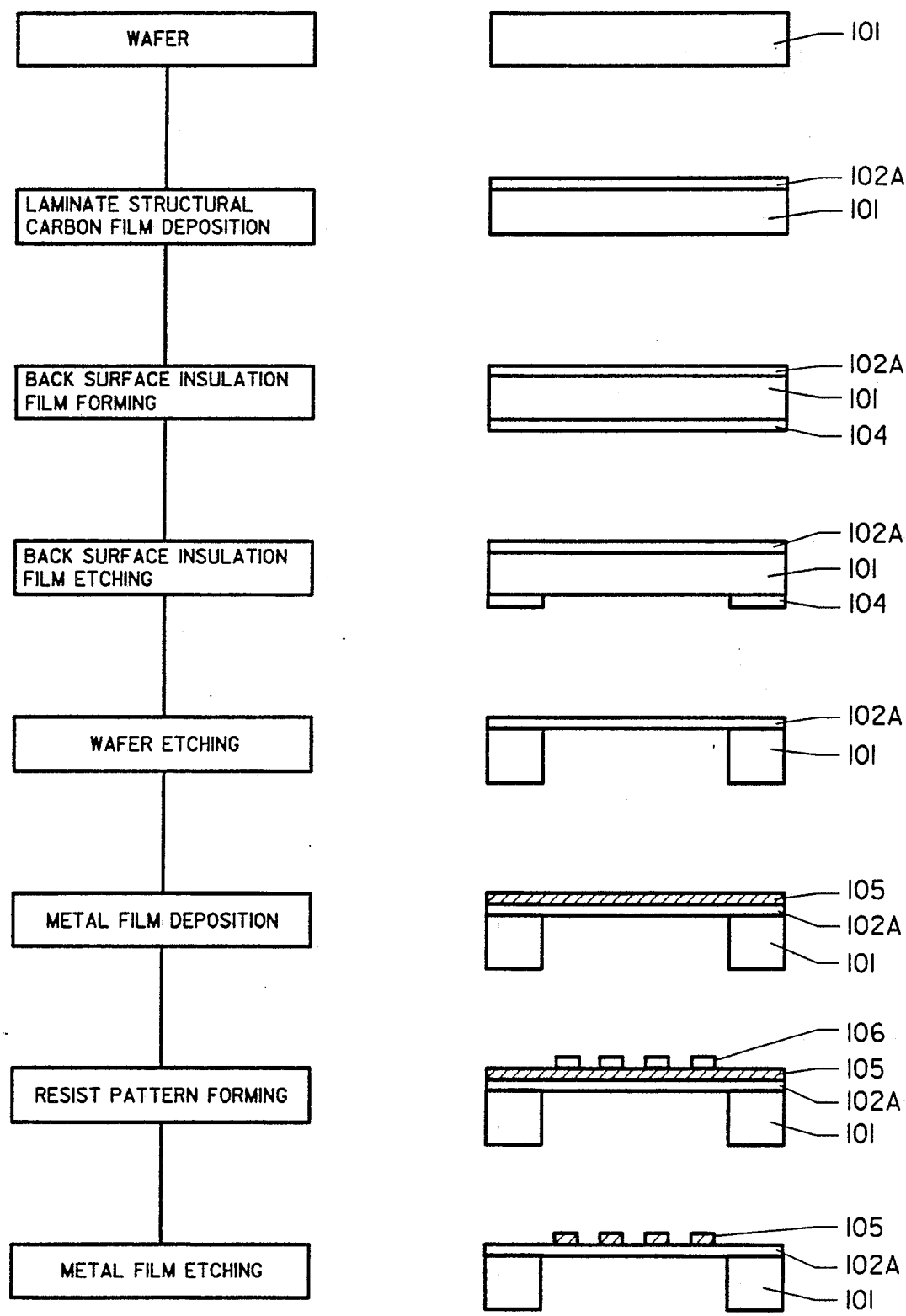
FIG. 3 shows the sequence of steps in the manufacturing process according to the present invention and the associated states of the resulting structure of the mask.

The process through which such a film is formed is diagrammatically shown in FIG. 3. Initially, a silicon wafer 101 is provided and alternating layers of inorganic insulating films such as the above-mentioned silicon carbide, silicon nitride, boron nitride and boron carbide are formed together with the carbon film, using an RF plasma chemical vapor deposition chamber, alternating the introduced gases, so as to establish the growth of either the carbon film or the compensating film. Formation of the carbon film may be accomplished by the introduction of methane (CH$_4$) or ethane (C$_2$H$_6$) as the reaction gas, which produces a carbon layer having an optical band gap on the order of a value greater than 2.0 eV and an extremely small hydrogen content. As noted previously, the thickness of each carbon layer 102 is on the order of 1,000-3,000Å. Between each carbon layer is a compressive stress-relieving layer 103. Where silicon carbide is employed as the material, a reaction gas such as SiH or Si$_2$H$_6$ and methane or ethane is introduced into the reaction chamber. Again, a conventional radio frequency voltage on the order of 13.5 MHz may be employed. The ambient pressure within the reactor chamber is adjusted as in the conventional processes described previously to adjust the optical properties (transmissivity/bandgap) of the compensation layer. A typical thickness of silicon carbide layer 103 is on the order of 500-2,000Å. Where a different material, such as boron carbide, is to be formed as the compressive stress-relieving layer, the reaction gas may comprise B$_2$H$_6$. A laminate structure is built up to a thickness on the order of 10,000-30,000Å (comprised of alternating layer of carbon having a thickness of 1,000-3,000Å) and compressive stress-compensating insulation film 103 (having a thickness on the of 500-2,000Å), to yield a laminate structure 102a formed atop the silicon substrate 101. Thereafter, an insulation film 104 is formed on the bottom surface of the substrate 101 and then selectively patterned to provide an etching mask for the silicon substrate 101. Silicon substrate 101 is then etched with a wet type of etchant, such as potassium hydroxide, to form a border support structure for the laminate film 102a. Since the film 102a comprises alternating layers of compressive stress carbon and tensile stress material (e.g. silicon carbide, boron carbide, boron nitride, silicon nitride) its structure remains effectively planar or flat, as shown in FIG. 3. There is no warping, and thereby optical distortion, of the mask support membrane.

Upon this highly planar and smooth laminate structure 102, a metallic film 15 of a metal, such as gold or tungsten, is deposited to a thickness on the order of 5,000-10,000Å. A layer of photoresist 106 is then selectively formed atop the metallic layer 105. The metallic layer is then etched using the photoresist mask to yield a patterned metallic layer atop the planar laminate structure of the carbon, compensating film membrane. The resulting mask can then be used in an X-ray photolithographic graphic process to obtain a high definition narrow line width structure.

While, in the foregoing description, silicon has been described as an exemplary material for the support substrate 101, other materials, such as quartz, may be used. While quartz has a smaller thermal coefficient of expansion than silicon, it induces a compressive stress in deposited carbon, which can be compensated by the films described above.

Figure 1:
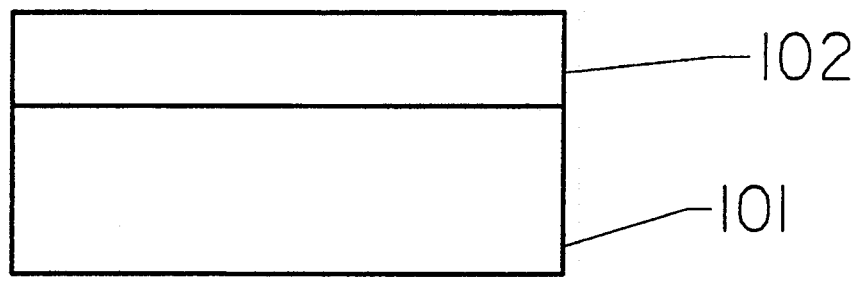
FIGS. 1(a) and (b) are diagrammatic side views of a conventional process for depositing carbon on a silicon substrate.
Figure 1:
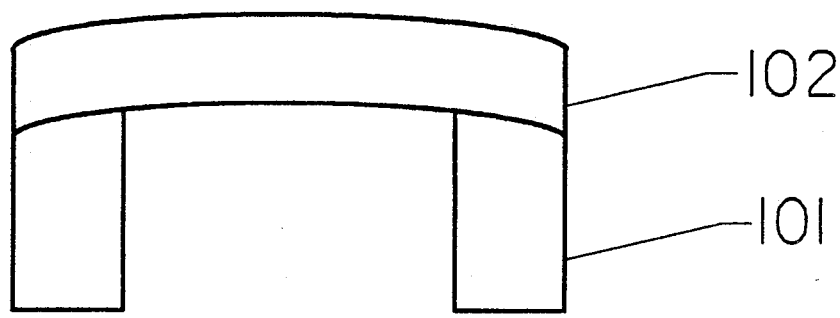

With the laminate structure of a carbon layer and a compressive stress-compensating layer, the mask support membrane of the present invention can be considered to be comprised of non-crystalline carbon, which inherently undergoes compressive stress when the underlying substrate is etched, as depicted in FIG. 1(b) described previously. With the incorporation of stress-compensating layers of material which have an inherent tensile stress, the resulting membrane has substantial flatness and mechanical stability. Moreover, because of the optical and X-ray transmissive properties of the compensation layers, the overall film has a high transmissivity with respect to both X-rays and visible light. Moreover, it enjoys both thermal chemical stability in addition to its mechanical strength.

Figure 2:
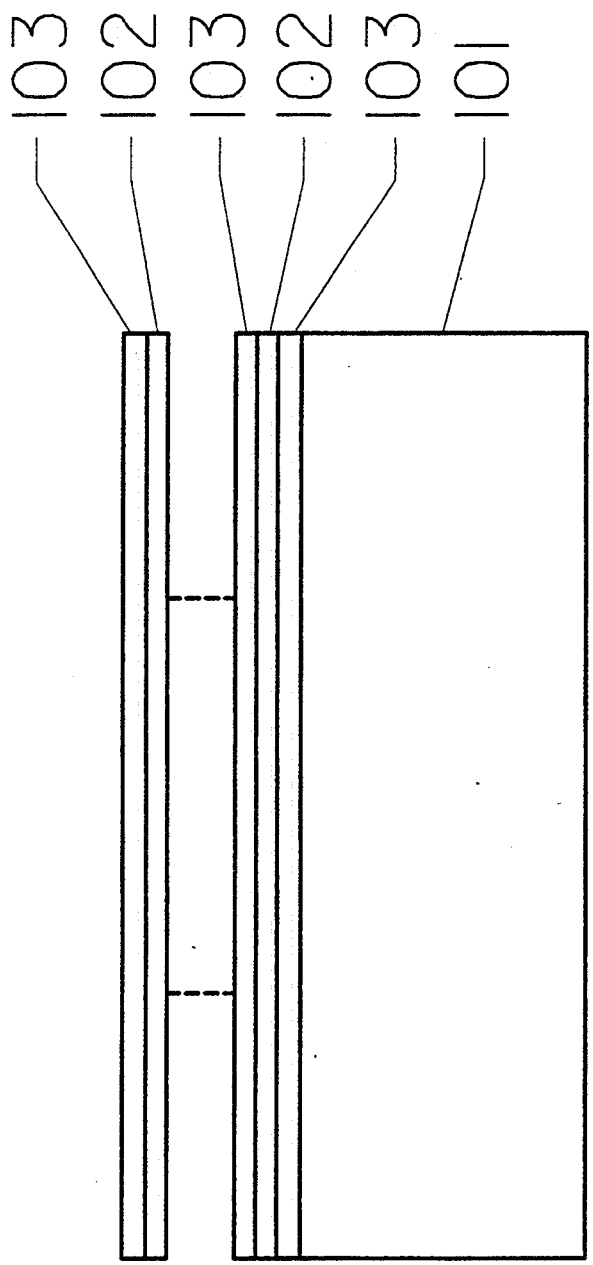
FIG. 2 is a diagrammatic side view of a multilayer laminate structure of carbon and a compressive stress-relieving film formed in alternate layers on a silicon substrate.

In addition to the above materials, a film such as silundum may be employed as the stress compensating layer. For this purpose, within the reaction chamber, only silane need to be added during the formation of a laminate structure shown in FIG. 2.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A method of manufacturing an X-ray lithography mask comprising the steps of:
   (a) forming, on a first planar surface of a support substrate, a multiple layer structure containing a first layer of carbon having an internal compressive stress characteristic and a second layer of a material having an internal tensile stress characteristic that serves to compensate for the compressive stress characteristic of the carbon layer, and thereby causes said multiple layer structure to have a substantially planar configuration;
   (b) selectively removing material from a second surface of said support substrate to yield a rim structure on which said multiple layer structure is supported; and
   (c) selectively forming an X-ray absorption layer on said multiple layer structure.

2. A method according to claim 1, wherein step (a) comprises forming said multiple layer structure as a laminate structure of multiple alternating layers of carbon having an internal compressive stress characteristic and a material having an internal tensile stress characteristic.

3. A method according to claim 1, wherein said support substrate is a silicon substrate and said material having said internal tensile stress characteristic is a material selected from the group consisting of silicon nitride, silicon carbide, boron nitride, boron carbide and silundum.

4. A method according to claim 2, wherein, within said laminate structure, the thickness of a carbon layer is on the order of 1000-3000 angstrom, the thickness of a tensile stress layer is on the order of 500-2000 angstroms, and the overall thickness of said laminate structure is on the order of 10000-30000 angstroms.

5. A method of manufacturing an X-ray lithography mask comprising the steps of:
   3 (a) providing a silicon substrate having a planar top surface;
   (b) plasma-depositing, on said planar top surface of said silicon substrate, a multiple layer, X-ray transmissive structure containing a first layer of carbon having an internal compressive stress characteristic and a second layer of inorganic material having an internal tensile stress characteristic, that effectively compensates for the compressive stress characteristic of the carbon layer and thereby causes said multiple layer, X-ray transmissive structure to retain a substantially planar configuration;
   (c) selectively removing material from a back surface of said support substrate, opposite to said planar top surface on which said X-ray transmissive structure has been formed in step (b), and thereby yield a rim structure on which said planar multiple layer, X-ray transmissive structure is supported; and
   (d) selectively forming an X-ray absorption layer on the planar, multiple layer, X-ray transmissive structure resulting from step (c).

6. A method according to claim 5, wherein step (b) comprises forming said multiple layer structure as a laminate structure of multiple alternating layers of carbon having said internal compressive stress characteristic and said inorganic material having an internal tensile stress characteristic.

7. A method according to claim 6, wherein, within said laminate structure, the thickness of a carbon layer is on the order of 1000-3000 angstrom, the thickness of a tensile stress layer is on the order of 500-2000 angstroms, and the overall thickness of said laminate structure is on the order of 10000-30000 angstroms.

8. A method according to claim 7, wherein said inorganic material having said internal tensile stress characteristic is a material selected from the group consisting of silicon nitride, silicon carbide, boron nitride, boron carbide and silundum.

9. A method according to claim 6, wherein the optical bandgap of a carbon layer is greater than 2.0 eV.

10. In a method of manufacturing an X-ray lithography mask, a layer of carbon, on which a patterned, X-ray absorption layer is to be formed, is deposited on a top, planar surface of a silicon support substrate and has an internal compressive stress characteristic, so that, during selective removal of silicon from a back surface of said silicon support substrate to yield a rim structure on which said carbon layer is supported, the compressive stress within said carbon layer causes distortion of the shape of said carbon layer, the improvement comprising the steps of:
    (a) forming, contiguous with said carbon layer, a layer of inorganic material that has an internal tensile stress characteristic which effectively compensates for the compressive stress characteristic of said carbon layer, thereby yielding a composite layer that retains its a planar configuration after selective removal of silicon from the back surface of said silicon support substrate; and
    (b) selectively forming a layer of X-ray absorption material on said composite layer.

11. The improvement according to claim 10, wherein step (a) comprises forming said composite layer as a laminate structure of multiple alternating layers of carbon having said internal compressive stress characteristic and an inorganic material having said internal tensile stress characteristic.

12. The improvement according to claim 11, wherein said inorganic material is a material selected from the group consisting of silicon nitride, silicon carbide, boron nitride, boron carbide and silundum.

13. The improvement according to claim 11, wherein, within said laminate structure, the thickness of a carbon layer is on the order of 1000-3000 angstrom, the thickness of a tensile stress layer is on the order of 500-2000 angstroms, and the overall thickness of said laminate structure is on the order of 10000-30000 angstroms.

14. An X-ray lithography mask comprising:
a support substrate having a planar top surface;
a multiple layer, X-ray transmissive structure formed on said planar top surface of said substrate, and containing a first layer of carbon having an internal compressive stress characteristic and a second layer of inorganic material having an internal tensile stress characteristic, that effectively compensates for the compressive stress characteristic of the carbon layer and thereby causes said multiple layer, X-ray transmissive structure to retain a substantially planar configuration; and
an X-ray absorption layer selectively formed on said planar, multiple layer, X-ray transmissive structure.

15. A mask according to claim 14, wherein said multiple layer structure comprises a laminate structure of multiple alternating layers of carbon having said internal compressive stress characteristic and said inorganic material having an internal tensile stress characteristic.

16. A mask according to claim 15, wherein, within said laminate structure, the thickness of a carbon layer is on the order of 1000–3000 angstrom, the thickness of a tensile stress layer is on the order of 500–2000 angstroms, and the overall thickness of said laminate structure is on the order of 10000–30000 angstroms.

17. A mask according to claim 16, wherein said inorganic material having said internal tensile stress characteristic is a material selected from the group consisting of silicon nitride, silicon carbide, boron nitride, boron carbide and silundum.

18. A mask according to claim 15, wherein the optical bandgap of a carbon layer is greater than 2.0 eV.

* * * * *